(12) United States Patent
Kwon et al.

(10) Patent No.: US 12,433,137 B2
(45) Date of Patent: Sep. 30, 2025

(54) DISPLAY APPARATUS

(71) Applicant: Samsung Display Co., Ltd., Yongin-si (KR)

(72) Inventors: Ohjeong Kwon, Yongin-si (KR); Seungyeon Jeong, Yongin-si (KR); Hongyeon Lee, Yongin-si (KR); Hyeoji Kang, Yongin-si (KR); Jaejin Lyu, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 398 days.

(21) Appl. No.: 17/583,955

(22) Filed: Jan. 25, 2022

(65) Prior Publication Data

US 2022/0238848 A1 Jul. 28, 2022

(30) Foreign Application Priority Data

Jan. 26, 2021 (KR) .................. 10-2021-0011028

(51) Int. Cl.
| | |
|---|---|
| *H10K 59/80* | (2023.01) |
| *H10K 50/86* | (2023.01) |
| *H10K 59/12* | (2023.01) |
| *H10K 85/30* | (2023.01) |
| *H10K 85/60* | (2023.01) |

(52) U.S. Cl.
CPC ....... *H10K 59/8731* (2023.02); *H10K 50/865* (2023.02); *H10K 59/879* (2023.02); *H10K 59/8792* (2023.02); *H10K 85/30* (2023.02); *H10K 85/657* (2023.02); *H10K 85/6572* (2023.02); *H10K 59/12* (2023.02)

(58) Field of Classification Search
None
See application file for complete search history.

(56) References Cited

U.S. PATENT DOCUMENTS

| | | | |
|---|---|---|---|
| 8,536,781 B2 | 9/2013 | Lee et al. | |
| 2004/0252088 A1* | 12/2004 | Kawachi | H10K 50/865 345/76 |
| 2008/0218064 A1 | 9/2008 | Cho et al. | |
| 2010/0219429 A1* | 9/2010 | Cok | H10K 59/877 257/89 |
| 2011/0025199 A1* | 2/2011 | Park | H10K 50/865 313/504 |
| 2014/0077183 A1* | 3/2014 | Lee | H10K 71/00 257/40 |
| 2014/0117330 A1 | 5/2014 | Cho et al. | |

(Continued)

FOREIGN PATENT DOCUMENTS

| | | | | |
|---|---|---|---|---|
| CN | 102422341 A | * | 4/2012 | ........... G09G 3/2003 |
| CN | 110832365 B | * | 7/2022 | ............ C08F 224/00 |

(Continued)

*Primary Examiner* — Duane N Taylor, Jr.
(74) *Attorney, Agent, or Firm* — Womble Bond Dickinson (US) LLP

(57) ABSTRACT

A display apparatus includes: a substrate; a layer disposed on the substrate and including an organic light-emitting device; a low-reflection inorganic layer disposed on the display device layer including an inorganic material; a light-blocker is disposed on the low-reflection inorganic layer; and a reflection-controlling layer disposed on the light-blocker.

19 Claims, 4 Drawing Sheets

(56) References Cited

U.S. PATENT DOCUMENTS

| | | | |
|---|---|---|---|
| 2014/0191215 A1* | 7/2014 | Tojo | H10K 59/38 257/40 |
| 2016/0087245 A1* | 3/2016 | Park | H10K 50/858 257/40 |
| 2016/0133880 A1 | 5/2016 | Lee et al. | |
| 2016/0380235 A1* | 12/2016 | Kim | H10K 85/6576 257/40 |
| 2017/0149018 A1 | 5/2017 | Choi et al. | |
| 2018/0053918 A1 | 2/2018 | Woo et al. | |
| 2018/0069070 A1 | 3/2018 | Lee et al. | |
| 2018/0083227 A1* | 3/2018 | Ju | H10K 50/171 |
| 2020/0152919 A1* | 5/2020 | Joo | H10K 59/38 |
| 2020/0212122 A1* | 7/2020 | Asaoka | H10K 50/115 |
| 2022/0381954 A1* | 12/2022 | Byun | G02B 1/115 |
| 2023/0408914 A1* | 12/2023 | Lee | G03F 7/039 |

FOREIGN PATENT DOCUMENTS

| | | | |
|---|---|---|---|
| JP | 2000223276 A | * | 8/2000 |
| KR | 10-0829753 | | 5/2008 |
| KR | 10-2011-0049476 | | 5/2011 |
| KR | 10-2014-0056498 A | | 5/2014 |
| KR | 10-1620092 | | 5/2016 |
| KR | 10-2017-0015713 | | 2/2017 |
| KR | 10-2017-0060216 A | | 6/2017 |
| KR | 10-2018-0021342 A | | 3/2018 |
| KR | 10-2018-0027706 | | 3/2018 |
| KR | 10-2018-0062253 | | 6/2018 |

* cited by examiner

DISPLAY APPARATUS

CROSS-REFERENCE TO RELATED APPLICATION

This application claims priority from and the benefit of Korean Patent Application No. 10-2021-0011028, filed on Jan. 26, 2021, which is hereby incorporated by reference for all purposes as if fully set forth herein.

BACKGROUND

Field

Embodiments of the invention relate generally to a display apparatus, and more particularly, to a display apparatus having reduced external light reflectance.

Discussion of the Background

An organic light-emitting display apparatus has self-emissive characteristics. Unlike a liquid crystal display apparatus, an organic light-emitting display apparatus may not require a separate light source, and thus has reduced thickness and reduced weight. In addition, an organic light-emitting display apparatus exhibits high quality characteristics such as low power consumption, high luminance, and a high reaction speed. In general, a polarizing plate or a color filter may be used for a user to view an image implemented through an organic light-emitting display indoors as well as outdoors.

The above information disclosed in this Background section is only for understanding of the background of the inventive concepts, and, therefore, it may contain information that does not constitute prior art.

SUMMARY

Applicant discovered that a polarizing plate may cause problems in a display apparatus such as lowering the brightness of light emitted from the display apparatus and increasing the thickness of the display apparatus due to the thickness of the polarizing plate. In addition, a display apparatus having a microcavity structure using a color filter has a poor reflectivity and a reflective color band. Thus, often a layer to improve flatness needs to be additionally introduced to resolve this problem.

Display apparatus constructed according to the principles and illustrative implementations of the invention demonstrate high optical efficiency while effectively reducing external light reflectance. For example, a low-reflection inorganic layer may be provided in the display apparatus to absorb light incident in the interior of the display apparatus and induce extinction interference between metals in an opening to thereby reduce or block light passing to the outside of the display apparatus. In other words, external light reflectance of the display apparatus may be reduced, and thus, display quality and visibility may be improved.

Display apparatus constructed according to the principles and illustrative implementations of the invention may avoid one or more of the above-noted problems in the art. For example, in some embodiments, the display apparatus may obviate the need for one or more of a polarizing plate, a wavelength-conversion member or a color-conversion member, such as a color filter, by enhancing anti-reflection performance of external light by including a low-reflection inorganic layer and reflection-controlling layer.

Additional features of the inventive concepts will be set forth in the description which follows, and in part will be apparent from the description, or may be learned by practice of the inventive concepts.

According to one aspect of the invention, a display apparatus includes: a substrate; a layer disposed on the substrate and including an organic light-emitting device; a low-reflection inorganic layer disposed on the layer including an inorganic material; a light-blocker is disposed on the low-reflection inorganic layer; and a reflection-controlling layer disposed on the light-blocker.

The inorganic material may have a refractive index of about 1 or greater.

The inorganic material may have an absorption coefficient of about 0.5 or greater.

The inorganic material may include ytterbium, bismuth, cobalt, molybdenum, titanium, zirconium, aluminum, chromium, niobium, platinum, tungsten, indium, tin, iron, nickel, tantalum, manganese, zinc, germanium, or any combination thereof.

The low-reflection inorganic layer may be made by thermal deposition of the inorganic material.

The low-reflection inorganic layer may have a thickness of about 0.1 nm to about 50 nm.

The layer may include a display device layer having the organic light-emitting device, and the organic light-emitting device may include: a pixel electrode; an interlayer disposed on the pixel electrode and including an emission layer; and a counter electrode on the interlayer.

The display device layer may further include a capping layer on the counter electrode, and the low-reflection inorganic layer is on the capping layer.

The capping layer may have a thickness in a range of about 1 nm to about 200 nm.

The reflection-controlling layer may include a dye, a pigment, or any combination thereof.

The reflection-controlling layer may include a compound having an oxazine moiety, a compound having a cyanine moiety, a compound having a tetraazaporphyrin moiety, or a compound having a squarylium moiety.

The reflection-controlling layer may include a compound of one of Formulae 1 to 4, as defined herein.

The maximum absorption wavelength of the reflection-controlling layer may have a first wavelength range of about 480 nm to about 510 nm or a second wavelength range of about 580 nm to about 610 nm.

The reflectance in a specular component included mode at a surface of the reflection-controlling layer may be about 10% or less.

The display apparatus may not include a polarizing plate.

The display apparatus may not include a wavelength-conversion member or a color-conversion member.

The light-blocker may include a light-blocking unit and the display apparatus may further include a thin-film encapsulation layer between the low-reflection inorganic layer and the light-blocking unit.

The display apparatus may further include a functional layer between the thin-film encapsulation layer and the reflection-controlling layer.

The display apparatus may further include a thin-film transistor electrically connected to the organic light-emitting device.

The thin-film transistor may include a semiconductor layer and a gate electrode overlapping a channel area of the semiconductor layer.

It is to be understood that both the foregoing general description and the following detailed description are illustrative and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate illustrative embodiments of the invention, and together with the description serve to explain the inventive concepts.

DETAILED DESCRIPTION

Figure 1:
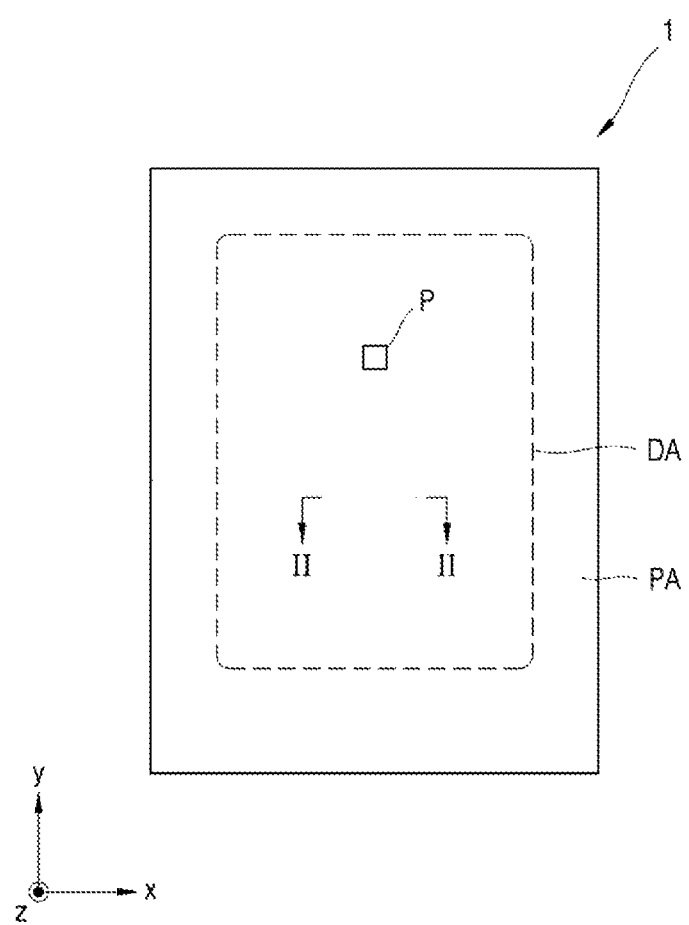
FIG. 1 is a schematic plan view of an embodiment of a display apparatus constructed according to the principles of the invention.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing illustrative features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a schematic plan view of an embodiment of a display apparatus constructed according to the principles of the invention.

As shown in FIG. 1, a display apparatus 1 may include a display area DA and a peripheral area PA. Pixels P including a display element may be arranged in the display area DA to provide a predetermined image.

The peripheral area PA may be a non-display area that may not include a display element. The peripheral area PA may not provide an image. The peripheral area may include, for example: a driver, such as a scan driver or a data driver, which may transmit electrical signals and power for application to the pixels P of the display area DA; a signal line, such as a scan line or a data line; and power lines which may provide power, such as a driving voltage (ELVDD) or a common voltage (ELVSS).

In FIG. 1, the display apparatus 1 is shown as having a substantially flat panel display surface, but embodiments are not limited thereto. In some embodiments, the display apparatus 1 may include a three-dimensional display surface or a substantially curved display surface.

In some embodiments, when the display apparatus 1 includes a three-dimensional display surface, the display apparatus 1 may include a plurality of display areas arranged in different directions, e.g., a generally polygonal columnar display surface. According to another embodiment, when the display apparatus 1 includes a substantially curved display surface, the display apparatus 1 may be implemented in various forms, such as a generally flexible, a generally foldable, or a generally rollable display apparatus.

FIG. 1 illustrates an embodiment in which the display area DA in the display apparatus 1 has a generally rectangular shape with generally rounded corners. However, according to another embodiment, the shape of the display area DA may be generally circular, generally elliptical, or generally polygonal, such as being generally triangular or generally pentagonal. According to another embodiment, the shape of the display area DA may be generally polygonal with generally rounded corners. In some embodiments, the display element may be an organic light-emitting device (OLED).

Hereinafter, the display apparatus 1 according to embodiments may be described as an organic light-emitting display apparatus. However, the display apparatus 1 is not limited thereto. In some embodiments, the display apparatus 1 may be a display apparatus such as an inorganic light-emitting display apparatus, an inorganic electroluminescence (EL) display apparatus, or a quantum dot light-emitting display apparatus. For example, the emission layer provided in the display apparatus 1 may include an organic material, an inorganic material, one or more quantum dots, an organic material and one or more quantum dots, or an inorganic material and one or more quantum dots.

Figure 2:
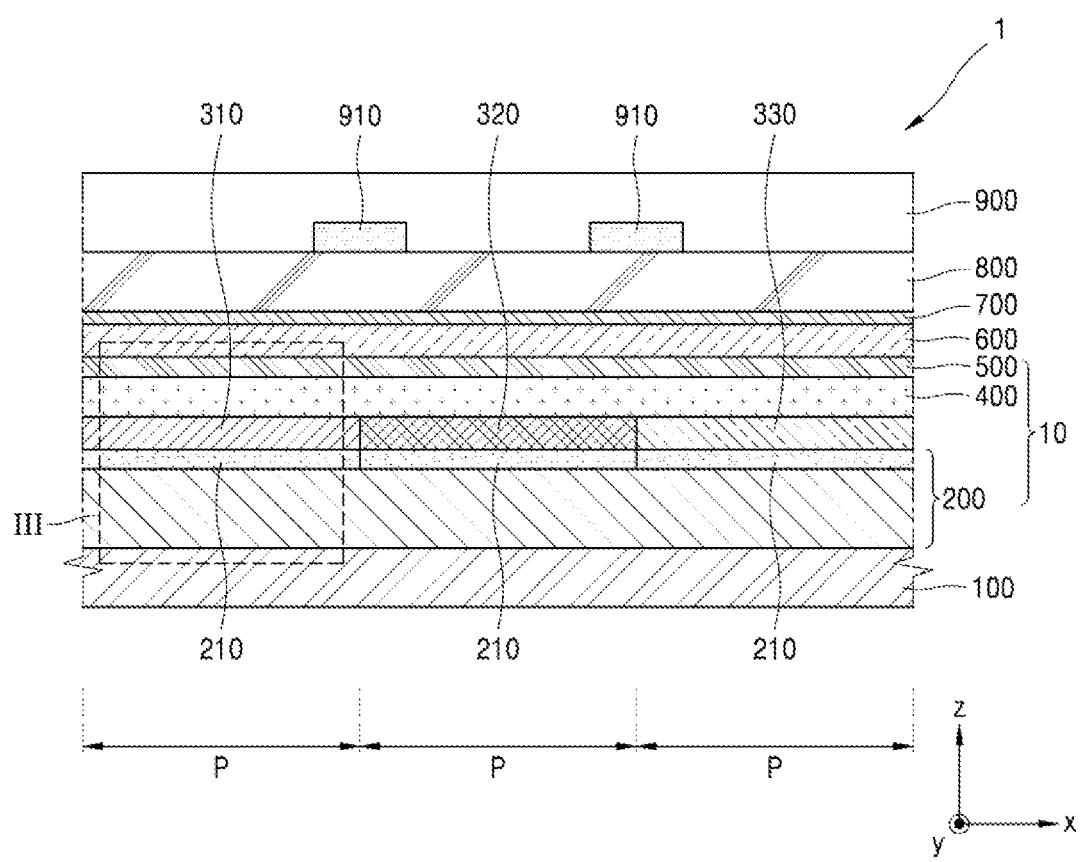
FIG. 2 is a schematic cross-sectional view of the display apparatus taken along line II-II of FIG. 1.
Figure 3A:
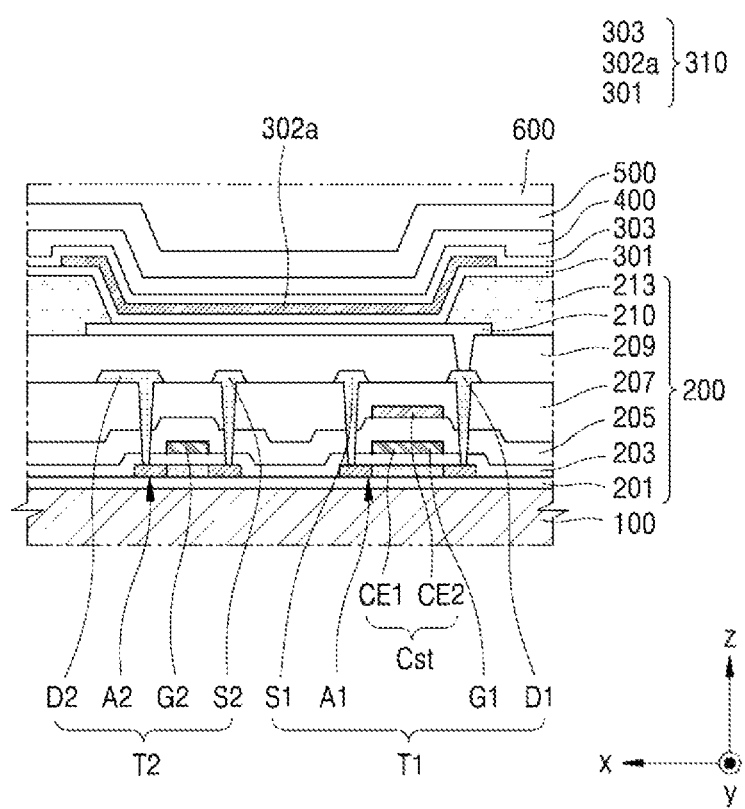
FIG. 3A is a schematic cross-sectional view of an embodiment of a display apparatus illustrating a display device layer, an interlayer, and a counter electrode of area III of FIG. 2.
Figure 3B:
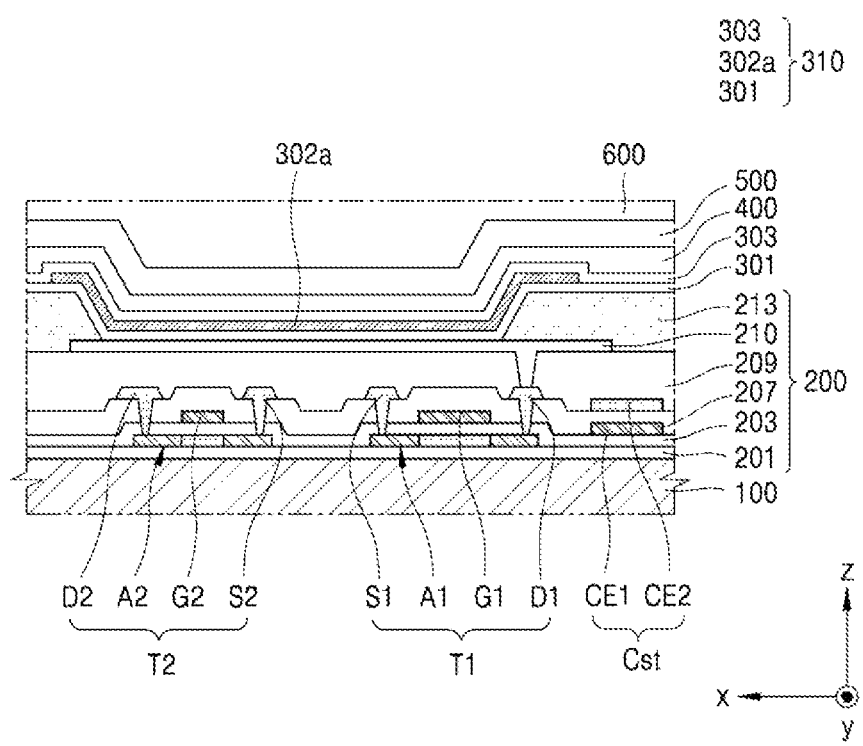
FIG. 3B is a schematic cross-sectional view of another embodiment of a display apparatus illustrating a display device layer, an interlayer, and a counter electrode of portion III of FIG. 2.

FIG. 2 is a schematic cross-sectional view of the display apparatus taken along line II-II of FIG. 1. FIG. 3A is a schematic cross-sectional view of an embodiment of a display apparatus illustrating a display device layer, an interlayer, and a counter electrode of area III of FIG. 2. FIG. 3B is a schematic cross-sectional view of another embodiment of a display apparatus illustrating a display device layer, an interlayer, and a counter electrode of portion III of FIG. 2.

As shown in FIG. 2, the substrate 100 in the display apparatus 1 may be flexible, and thus, the substrate 100 may be bent, folded, or rolled. The substrate may be a glass substrate or a plastic substrate. The substrate may be a flexible substrate including a plastic having excellent heat resistance and durability, for example, a polyimide, a polyethylene terephthalate (PET), a polycarbonate, a polyethylene naphthalate (PEN), a polyarylate (PAR), a polyetherimide, or any combination thereof. In some embodiments, the substrate 100 may be a polyimide (PI), a polyethersulfone (PES), a polyacrylate (PAR), a polyether imide (PEI), a polyethylene naphthalate (PEN), a polyethylene terephthalate (PET), a polyphenylene sulfide (PPS), a polyarylate, a polycarbonate (PC), a cellulose triacetate (TAC), a cellulose acetate propionate (CAP), a cyclic olefin polymer, or a cyclic olefin copolymer.

A layer in the form of a display device layer 10 may be on the substrate 100. The display device layer 10 may include a circuit layer 200, interlayers 310, 320, and 330, and a counter electrode 400. The circuit layer 200 may include the pixel electrode 210 formed for each of the pixels P, and the interlayers 310, 320, and 330 and the counter electrode 400 may be located on the pixel electrode 210.

The interlayers 310, 320, and 330 may respectively include emission layers that may emit different colors of light for each of the pixels P. For example, the interlayer 310 (hereinafter referred to as a "first interlayer") may include an emission layer including an organic material that may emit red light, the other interlayer 320 (hereinafter referred to as a "second interlayer") may include an emission layer including an organic material that may emit green light, and the still other interlayer 330 (hereinafter referred to as a "third interlayer") may include an emission layer including an organic material that may emit blue light. The first, second, and the third interlayers 310, 320, and 330 may each include, in addition to the emission layer that may emit light, at least one of a hole transport layer (HTL), a hole injection layer (HIL), an electron transport layer (ETL), and an electron injection layer (EIL).

The pixel electrode 210, the first interlayer 310, and the counter electrode 400 may be one organic light-emitting device. Holes injected from the pixel electrode 210 and electrons injected from the counter electrode 400 may recombine in the first interlayer 310, e.g., the emission layer, to produce excitons. These excitons may transition from an excited state to a ground state, thereby generating light. As such, the pixel electrode 210, the second interlayer 320, and the counter electrode 400 may be one organic light-emitting device, and the pixel electrode 210, the third interlayer 330, and the counter electrode 400 may be an organic light-emitting device. Each of the organic light-emitting devices may emit light. As described above, the organic light-emitting device may emit, for example, red, green, or blue light. The circuit layer 200 may include a circuit for applying signals and voltages to the aforementioned organic light-emitting devices. The circuit layer 200 may be understood by referring to FIGS. 3A and 3B.

As shown in FIG. 3A, the circuit layer 200 may include a driving thin-film transistor T1, a switching thin-film transistor T2, a storage capacitor Cst, and the pixel electrode 210 electrically connected to the driving thin-film transistor T1, the switching thin-film transistor T2, and the storage capacitor Cst. The driving thin-film transistor T1 may include a driving semiconductor layer A1, a driving gate electrode G1, a driving source electrode S1, and a driving drain electrode D1. The switching thin-film transistor T2 may include a switching semiconductor layer A2, a switching gate electrode G2, a switching source electrode S2, and a switching drain electrode D2. The storage capacitor Cst may include first and second storage capacitor plates CE1 and CE2.

A buffer layer 201 may be between the substrate 100 and the driving semiconductor layer A1 and switching semiconductor layer A2. A gate insulating layer 203 may be between the driving semiconductor layer A1 and switching semiconductor layer A2 and the driving gate electrode G1 and switching gate electrode G2. A dielectric material layer 205 may be between the first and second storage capacitor plates CE1 and CE2. An interlayer insulating layer 207 may be between the driving gate electrode G1 and switching gate electrode G2 and the driving source electrode S1, driving drain electrode D1, switching source electrode S2, and switching drain electrode D2. An insulating layer 209 may be under the pixel electrode 210.

The buffer layer 201 and the gate insulating layer 203 may be a single layer or a multilayer including an inorganic material such as a silicon nitride ($SiN_x$) and/or a silicon oxide ($SiO_x$). The dielectric material layer 205 and the interlayer insulating layer 207 may be a single layer or a multilayer including an inorganic material such as a silicon oxide, a silicon nitride, and/or an aluminum oxide ($Al_2O_3$). The insulating layer 209 may include an organic material including a common general polymer, such as a poly(methyl methacrylate) (PMMA) or a polystyrene (PS), a polymer derivative having a phenol-based group, an acryl-based polymer, an imide-based polymer, an arylether-based polymer, an amide-based polymer, a fluorine-based polymer, a p-xylene-based polymer, a vinylalcohol-based polymer, or a mixture thereof, but embodiments are not limited thereto.

The pixel electrode 210 may be on the insulating layer 209 which may be a flattening layer. The pixel electrode 210 may be a transparent conductive oxide (TCO) layer. In some embodiments, the pixel electrode 210 may be a metal thin film including silver (Ag) or a silver (Ag) alloy or may be a multilayer of the TCO layer formed on the metal thin film. In some embodiments, the pixel electrode 210 may be three layers of an indium tin oxide (ITO)/Ag/ITO respectively having thicknesses of 70 Å/850 Å/50 Å. The pixel electrode 210 may be electrically connected to the driving source electrode S1 or the driving drain electrode D1 of the driving thin-film transistor T1 through contact holes.

A pixel-defining film 213 may cover edge portions of the pixel electrode 210 while leaving the pixel electrode 210 exposed. The pixel-defining film 213 may include organic and inorganic insulating materials, or only organic insulating materials or inorganic insulating materials. An emission layer 302a in the first interlayer 310 may include an organic material that may emit red light and may overlap the pixel electrode 210 exposed through the pixel-defining film 213. First and second functional layers 301 and 303 may each independently be above and/or under the emission layer 302a. In some embodiments, the pixel-defining film 213 may include a black material or a material having an optical density (OD) of about 1.

The first functional layer 301 may be located between the pixel electrode 210 and the emission layer 302a. The first functional layer 301 may include a hole transport layer (HTL) and a hole injection layer (HIL). The second functional layer 303 may be located between the emission layer 302a and the counter electrode 400. The second functional layer 303 may include an electron transport layer (ETL) and an electron injection layer (EIL).

The emission layer 302a and the first and second functional layers 301 and 303 may include a low-molecular-weight organic material or a polymer material. When the emission layer 302a and the first and second functional layers 301 and 303 includes a low-molecular-weight organic material, various organic materials may be used. For example, copper phthalocyanine (CuPc), N,N'-bis(naphtha-len-1-yl)-N,N'-bis(phenyl)benzidine (NPB), or tris-8-hydroxyquinoline aluminum ($Alq_3$) may be used. When the emission layer 302a and the first and second functional layers 301 and 303 include a polymer material, the first functional layer 301 may include a hole transport layer. The hole transport layer (HTL) may include a poly(3,4-ethylenedioxythiophene) (PEDOT), and the emission layer 302a may include a polyfluorene-based polymer material, but embodiments are not limited thereto.

The counter electrode 400 may be integrally formed such that the counter electrode 400 may fully cover the substrate 100. The counter electrode 400 may be a semi-transmissive metal thin film including at least one of Li, Ca, LiF/Ca, LiF/Al, Al, Mg, Ag, and an alloy of Ag and Mg, each having a low work function. In some embodiments, the counter electrode 400 may include the aforementioned semi-transmissive metal thin film and a transmissive conductive oxide film of an ITO, an indium zinc oxide (IZO), ZnO, $In_2O_3$, an indium gallium oxide (IGO) or an aluminum zinc oxide (AZO) on the semi-transmissive metal thin film.

In FIG. 3A, the storage capacitor Cst in the circuit layer 200 is shown as being arranged for each of the driving thin-film transistor T1 and the switching thin-film transistor T2, but embodiments are not limited thereto. In FIG. 3B, the storage capacitor Cst may overlap the driving thin-film transistor T1. For example, the first storage capacitor plate CE1 and the driving gate electrode G1 may be identical layers, and the storage capacitor Cst may be arranged to overlap the driving thin-film transistor T1.

According to embodiments described in relation to FIGS. 3A and 3B, the driving gate electrode G1 and switching gate electrode G2 of the driving thin-film transistor T1 and switching thin-film transistor T2 may respectively be shown as being on the driving semiconductor layer A1 and the switching semiconductor layer A2, but embodiments are not limited thereto. In some embodiments, the driving gate electrode G1 and the switching gate electrode G2 may respectively be under the driving semiconductor layer A1 and the switching semiconductor layer A2. Depending on the position of each of the driving gate electrode G1 and the switching gate electrode G2, the driving semiconductor layer A1 and the switching semiconductor layer A2 may be directly on the buffer layer 201 in some embodiments. In some embodiments, the driving gate electrode G1 and the switching gate electrode G2 may be directly on the buffer layer 201.

By referring to FIGS. 3A and 3B, the pixel P provided with the first interlayer 310 is described above. However, each of the pixels P provided with the second and third interlayer 320 and 330 may also have the same structure, and since the detailed description thereof is the same as described above, and it is omitted herein to avoid redundancy.

Referring back to FIG. 2, a low-reflection inorganic layer 600 including an inorganic material may be on the display device layer 10. In some embodiments, the inorganic material included in the low-reflection inorganic layer 600 may have a refractive index of about 1 or greater. In some embodiments, the inorganic material included in the low-reflection inorganic layer 600 may have an absorption coefficient of about 0.5 or greater. Furthermore, the low-reflection inorganic layer 600 including the inorganic material may have an absorption coefficient of about 0.5 or greater.

In some embodiments, the inorganic material may include ytterbium (Yb), bismuth (Bi), cobalt (Co), molybdenum (Mo), titanium (Ti), zirconium (Zr), aluminum (Al), chromium (Cr), niobium (Nb), platinum (Pt), tungsten (W), indium (In), tin (Sn), iron (Fe), nickel (Ni), tantalum (Ta), manganese (Mn), zinc (Zn), germanium (Ge), or any combination thereof. In some embodiments, the low-reflection inorganic layer 600 may be formed by thermal deposition of the inorganic material. Light incident from the outside in the interior of the display apparatus 1 may be reflected by layers of the display apparatus 1 and may cause problems such as exposure to the outside or deterioration of display quality.

In the display apparatus according to one or more embodiments, the low-reflection inorganic layer 600 may absorb light incident on the interior of the display apparatus 1 and induce extinction interference between metals in an opening to thereby reduce or block light passing to the outside of the display apparatus 1. In other words, external light reflectance of the display apparatus 1 may be reduced, and thus, display quality and visibility may be improved. In addition, the display apparatus 1 including the low-reflection inorganic layer 600 may be suitable in applications requiring flexibility due to low power consumption, excellent light efficiency, and reduced panel thickness.

In some embodiments, the thickness of the low-reflection inorganic layer 600 may be in a range of about 0.1 nanometers (nm) to about 50 nm, for example, about 0.5 nm to about 30 nm, or for example, about 1 nm to about 20 nm. When the thickness of the low-reflection inorganic layer 600 is within any of these ranges, external light reflectance of the display apparatus 1 may be reduced, and thus visibility may be improved, and light efficiency may be excellent. In addition, power consumption and panel thickness of the display apparatus 1 may be reduced.

In some embodiments, the display device layer 10 may further include a capping layer 500 located on the counter electrode 400, and the low-reflection inorganic layer 600 may be located on the capping layer 500. The capping layer 500 may improve the external luminescence efficiency of the organic light-emitting device based on, although not wanting to be bound by theory, the principle of constructive interference. In some embodiments, the capping layer 500 may include a material having a refractive index (at 589 nm) of about 1.6 or greater. The capping layer 500 may be an organic capping layer including an organic material, an inorganic capping layer including an inorganic material, or a composite capping layer including an organic material and an inorganic material. In some embodiments, the composite capping layer may include an inner layer of organic material and an outer layer of inorganic material.

In some embodiments, the capping layer 500 may include carbocyclic compounds, heterocyclic compounds, amine group-containing compounds, porphine derivatives, phthalocyanine derivatives, naphthalocyanine derivatives, alkali metal complexes, alkaline earth metal complexes, or any combination thereof. The carbocyclic compounds, the heterocyclic compounds, and the amine group-containing compounds may optionally be substituted with a substituent of O, N, S, Se, Si, F, Cl, Br, I, or any combination thereof.

In one or more embodiments, the capping layer 500 may include one of Compounds HT28 to HT33, one of Compounds CP1 to CP6, bis(naphthalen-1-yl)-N,N'-bis(phenyl) benzidine (β-NPB), or any combination thereof:

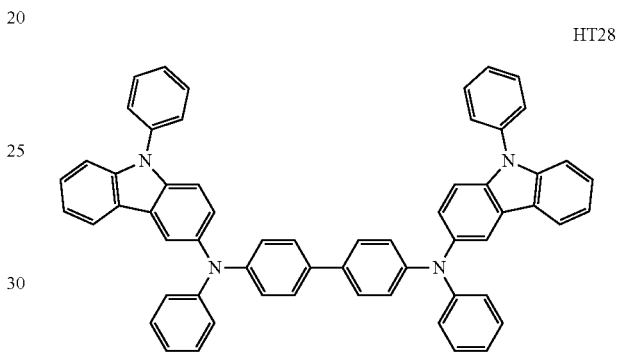

HT28

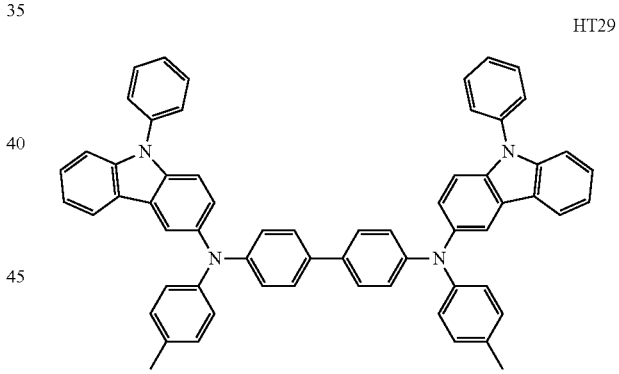

HT29

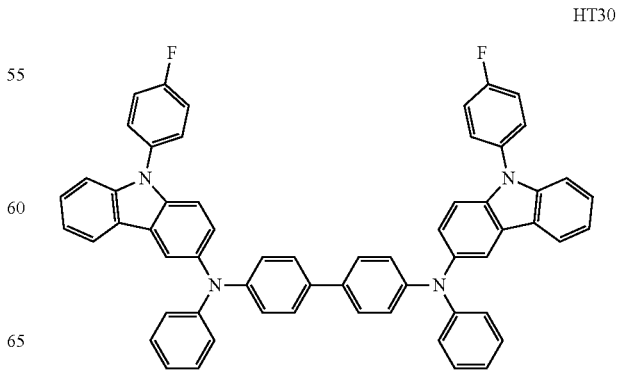

HT30

HT31
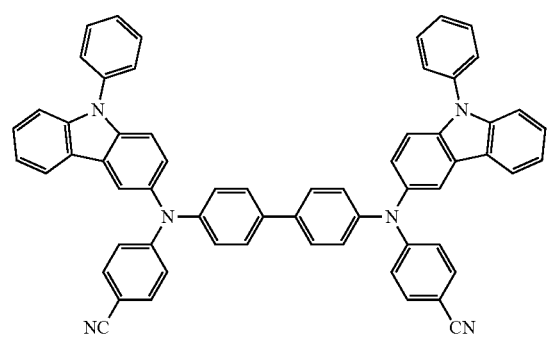
HT32
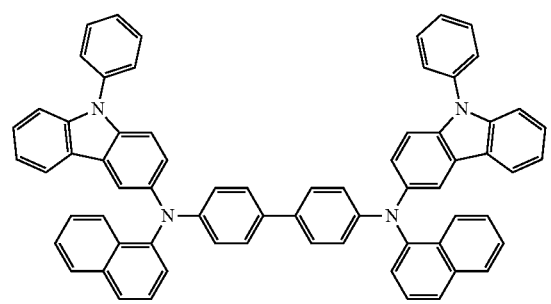
HT33
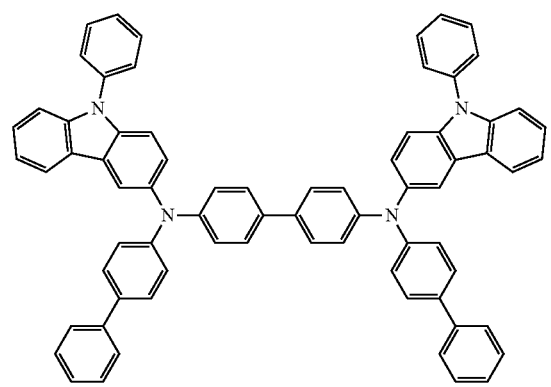
CP1
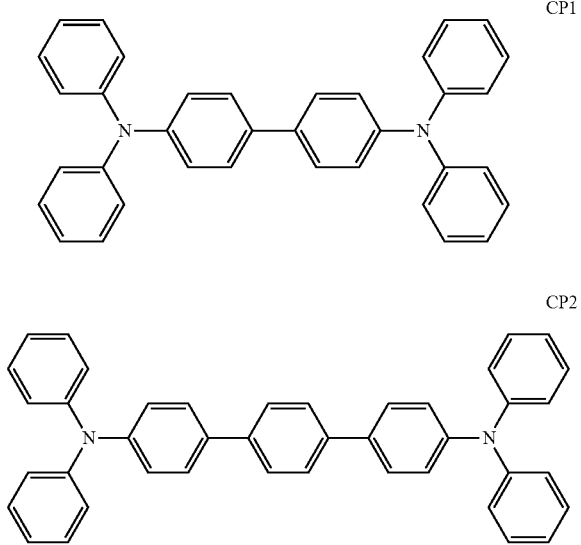
CP2
CP3
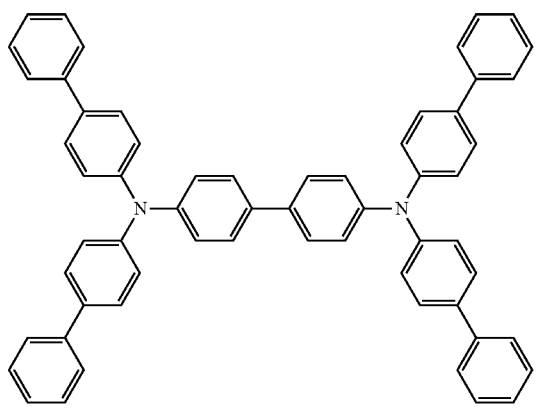
CP4
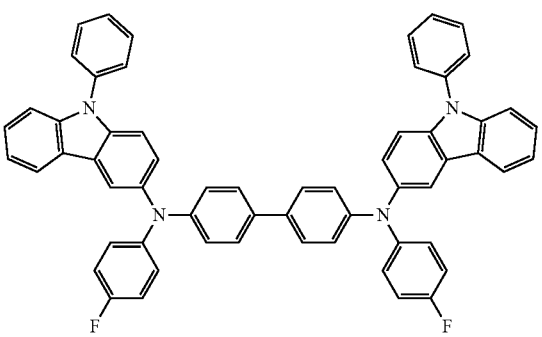
CP5
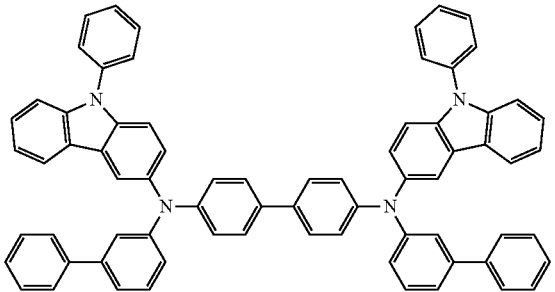
CP6
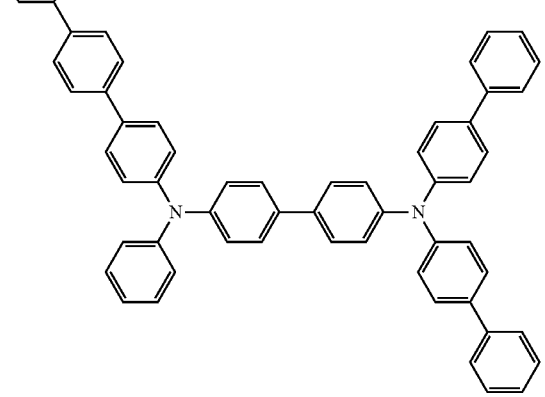

-continued

β-NPB

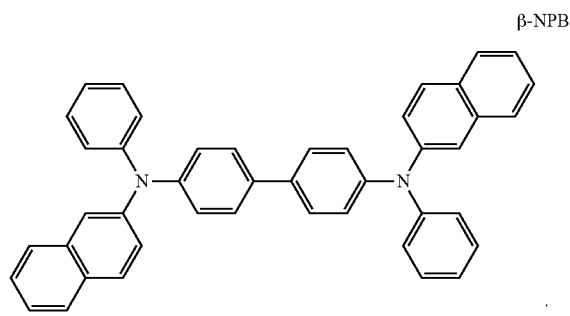

In some embodiments, the capping layer 500 may be in a range of about 1 nm to about 200 nm, for example, about 5 nm to about 150 nm, or for example, about 10 nm to about 100 nm. A light-blocker in the form of light-blocking unit 910 may be located on the low-reflection inorganic layer 600, and a reflection-controlling layer 900 may be located on the light-blocking unit 910.

The light-blocking unit 910 may include a light-absorbing material such as carbon black, and the light-blocking unit 910 may be located between the adjacent pixels P. The light-blocking unit 910 may absorb light reflected from the inside of the display apparatus 1, thereby preventing the light from traveling to the outside, reducing external light reflectance, and improving contrast. The reflection-controlling layer 900 may selectively absorb light reflected from the inside of the display apparatus 1 according to a wavelength, thereby preventing a decrease in optical efficiency and improving visibility of the display apparatus 1. In some embodiments, the reflection-controlling layer 900 may include a dye, a pigment, or a combination thereof.

In some embodiments, the reflection-controlling layer 900 may include a compound including an oxazine moiety in the form of an oxazine-based compound, a compound including a cyanine moiety in the form of a cyanine-based compound, a compound including a tetraazaporphyrin moiety in the form of a tetraazaporphyrin-based compound, or a compound including a squarylium moiety in the form of a squarylium-based compound.

For example, the reflection-controlling layer 900 may include a compound represented by one of Formulae 1 to 4:

Formula 1

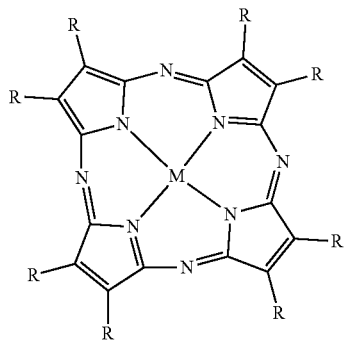

Formula 2

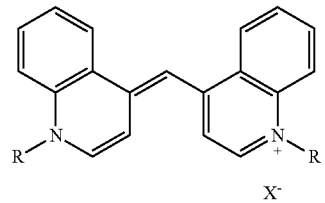

Formula 3

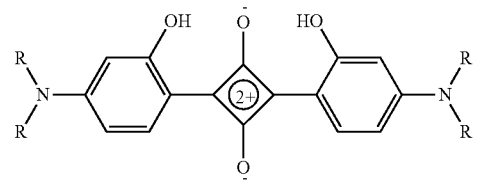

Formula 4

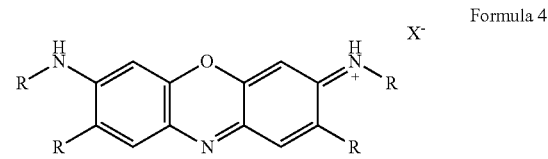

wherein, in Formulae 1 to 4,

M may be a metal,

X— may be a monovalent anion,

R(s) may be identical to or different from each other and may each be: hydrogen, deuterium (-D), —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), —P(=O)($Q_{11}$)($Q_{12}$), or any combination thereof; a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), —P(=O)($Q_{21}$)($Q_{22}$), or any combination thereof; or —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), or —P(=O)($Q_{31}$)($Q_{32}$).

$Q_{11}$ to $Q_{13}$, $Q_{21}$ to $Q_{23}$, and $Q_{31}$ to $Q_{33}$ may each independently be hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

In some embodiments, X— may be a halide ion, a carboxylate ion, a nitrate ion, a sulfonate ion, or a bisulfate ion. For example, X— may be F—, Cl—, Br—, I—, CH₃COO—, NO₃—, HSO₄—, a propionate ion, or a benzenesulfonate ion.

In some embodiments, a maximum absorption wavelength of the reflection-controlling layer 900 may be included in a first wavelength range of about 480 nm to about 510 nm or a second wavelength range of about 580 nm to about 610 nm. That is, the reflection-controlling layer 900 may absorb light of a wavelength outside the red, green, or blue emission wavelength range of the organic light-emitting device. Thus, the display apparatus 1 may have excellent optical efficiency.

In some embodiments, reflectance in a specular component included (SCI) mode at a surface of the reflection-controlling layer 900 may be 10 percent (%) or lower. That is, the reflection-controlling layer 900 may absorb external light reflection of the display apparatus 1, and thus may improve visibility. In some embodiments, the display apparatus 1 may not include a polarizing plate.

With respect to external light, anti-reflection performance of the display apparatus 1 including the low-reflection inorganic layer 600 and the reflection-controlling layer 900 may be equal to or better than a display apparatus using a polarizing plate. Thus, brightness of the emitted light is not reduced, and optical efficiency of the display apparatus 1 may be excellent. In some embodiments, the display apparatus 1 may not include a wavelength-conversion member or a color-conversion member, such as a color filter.

With respect to external light, anti-reflection performance of the display apparatus 1 including the low-reflection inorganic layer 600 and the reflection-controlling layer 900 may be equal to or better than a display apparatus using a wavelength-conversion member or a color-conversion member. In addition, the display apparatus 1 according to an embodiment may selectively absorb light of a specific wavelength such that the brightness of the emitted light may not decrease. Thus, the optical efficiency of the display apparatus 1 may be excellent.

In addition, when a wavelength-conversion member or a color-conversion member is used, a reflective color band may be commonly generated, and an organic layer that may improve flatness is additionally provided to compensate for the reflective color band. Thus, the thickness of a display apparatus may be increased, and the process may not be efficient.

As the display apparatus 1 according to an embodiment may include the low-reflection inorganic layer 600 and the reflection-controlling layer 900, a reflective color band may not be generated, and as the reflection-controlling layer 900 may be a top portion of the display apparatus 1, a thin high-quality display apparatus may be achieved. In some embodiments, a thin-film encapsulation unit 700 may be between the low-reflection inorganic layer 600 and the light-blocking unit 910. The thin-film encapsulation unit 700 may be on the display device layer 10 to protect the organic light-emitting device from moisture or oxygen. The thin-film encapsulation unit 700 may include at least one inorganic layer and/or at least one organic layer. For example, the thin-film encapsulation unit 700 may include a structure in which at least one inorganic layer and at least one organic layer may be alternately stacked.

In some embodiments, the at least one inorganic layer in the thin-film encapsulation unit 700 may include an aluminum nitride (AlN), an aluminum oxide (Al₂O₃) a titanium nitride (TiN), a titanium oxide (TiO₂), a silicon oxynitride (SiON), a silicon nitride (SiN$_x$), or a silicon oxide (SiO$_x$). The inorganic layer may protect the counter electrode 400 and the first, second, and third interlayers 310, 320, and 330 from moisture or the like.

In some embodiments, the at least one organic layer in the thin-film encapsulation unit 700 may include a polymer-based material such as a polymethyl methacrylate (PMMA), a polycarbonate (PC), a polystyrene (PS), an acryl-based resin, an epoxy-based resin, a polyimide, or a polyethylene. In some embodiments, the organic layer may be thicker than the inorganic layer. The organic layer may relieve internal stress of the inorganic layer, supplement defects in the inorganic layer, and flatten the inorganic layer.

In some embodiments, a functional layer 800 may be between the thin-film encapsulation unit 700 and the reflection-controlling layer 900. The functional layer 800 may include an interlayer dielectrics (ILD) including an organic material or a passivation layer. In some embodiments, the functional layer 800 may include a plurality of layers having different refractive indices and/or an optical functional layer including a lens. In some embodiments, the functional layer 800 may include a touch electrode layer including electrodes for recognizing a touch input.

In some embodiments, a back film may be arranged on the back of the substrate 100, for example, on the opposite side of the circuit layer 200. The back film may include a back protective layer, a black layer, a buffer layer, or a combination thereof. The back film may be attached to and arranged on the back of the substrate 100 using an adhesive agent or an adhesive tape. For example, a back film may be arranged on the back of the substrate, and the back film may include a back protective layer including PET, a black layer including black ink, and a buffer layer including a polymer resin material.

In some embodiments, the first, second, and third interlayers 310, 320, and 330 of each of the pixels P in the display apparatus 1 may each have different thicknesses. The thickness of each of the first, second, and third interlayers 310, 320, and 330 may be determined according to a wavelength of emitted light and a refractive index of the first, second, and third interlayers 310, 320, and 330. Each of the first, second, and third interlayers 310, 320, and 330 may form a microcavity structure together with the counter electrode 400 to prevent reflection of external light. For example, some light incident from the outside may be reflected by the counter electrode 400, and light that has passed through the counter electrode 400 may be reflected by the pixel electrode 210 through the third interlayer 330. Because light reflected from the counter electrode 400 and the light reflected from the pixel electrode 210 may undergo destructive interference with each other, light exposure to the outside of the display apparatus 1 may be reduced. That is, reflectance of external light may be reduced.

Due to the aforementioned microcavity structure, external light may cause destructive interference, and light emitted from each of the first, second, and third interlayers 310, 320, and 330 may undergo constructive interference, thus further improving optical efficiency of the display apparatus 1.

DEFINITION OF TERMS

As used herein, the term "atom" may mean an element or its corresponding radical bonded to one or more other atoms.

The terms "hydrogen" and "deuterium" refer to their respective atoms and corresponding radicals with the deuterium radical abbreviated "-D", and the terms "—F, —Cl, —Br, and —I" are radicals of, respectively, fluorine, chlorine, bromine, and iodine.

As used herein, a substituent for a monovalent group, e.g., alkyl, may also be, independently, a substituent for a corresponding divalent group, e.g., alkylene.

In some embodiments, a "low-reflection inorganic layer" means a layer having an inorganic material and an absorption coefficient of about 0.5 or greater.

In some embodiments, a "reflection-controlling layer" means a layer having a maximum absorption wavelength in the range of about 480 nm to about 510 nm or about 580 nm to about 610 nm and an SCI of about 10% or lower.

The term "$C_3$-$C_{60}$ carbocyclic group" or "$C_1$-$C_{60}$ heterocyclic group" as used herein may be a group fused with any suitable cyclic group, a monovalent group, or a polyvalent group (e.g., a divalent group, a trivalent group, a tetravalent group, or the like), depending on the structure of the formula to which the term is applied. For example, a "benzene group" may be a benzo group, a phenyl group, a phenylene group, or the like, and this may be understood by one of ordinary skill in the art, depending on the structure of the formula including the "benzene group".

Examples of the monovalent $C_3$-$C_{60}$ carbocyclic group and the monovalent $C_1$-$C_{60}$ heterocyclic group may include a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic fused polycyclic group, and a monovalent non-aromatic fused heteropolycyclic group. Examples of the divalent $C_3$-$C_{60}$ carbocyclic group and the divalent $C_1$-$C_{60}$ heterocyclic group may include a $C_3$-$C_{10}$ cycloalkylene group, a $C_1$-$C_{10}$ heterocycloalkylene group, a $C_3$-$C_{10}$ cycloalkenylene group, a $C_1$-$C_{10}$ heterocycloalkenylene group, a $C_6$-$C_{60}$ arylene group, a $C_1$-$C_{60}$ heteroarylene group, a divalent non-aromatic fused polycyclic group, and a substituted or unsubstituted divalent non-aromatic fused heteropolycyclic group.

The term "$C_1$-$C_{60}$ alkyl group" as used herein refers to a linear or a branched aliphatic hydrocarbon monovalent group having 1 to 60 carbon atoms, and examples thereof include a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an iso-nonyl group, a sec-nonyl group, a tert-nonyl group, an n-decyl group, an isodecyl group, a sec-decyl group, and a tert-decyl group. The term "$C_1$-$C_{60}$ alkylene group" as used herein refers to a divalent group having a structure corresponding to the $C_1$-$C_{60}$ alkyl group.

The term "$C_2$-$C_{60}$ alkenyl group" as used herein refers to a monovalent hydrocarbon group having at least one carbon-carbon double bond in the middle or at the terminus of the $C_2$-$C_{60}$ alkyl group. Examples thereof include an ethenyl group, a propenyl group, and a butenyl group. The term "$C_2$-$C_{60}$ alkenylene group" as used herein refers to a divalent group having a structure corresponding to the $C_2$-$C_{60}$ alkenyl group.

The term "$C_2$-$C_{60}$ alkynyl group" as used herein refers to a monovalent hydrocarbon group having at least one carbon-carbon triple bond in the middle or at the terminus of the $C_2$-$C_{60}$ alkyl group. Examples thereof include an ethynyl group and a propynyl group. The term "$C_2$-$C_{60}$ alkynylene group" as used herein refers to a divalent group having a structure corresponding to the $C_2$-$C_{60}$ alkynyl group.

The term "$C_1$-$C_{60}$ alkoxy group" as used herein refers to a monovalent group represented by —$OA_{101}$ (wherein $A_{101}$ is a $C_1$-$C_{60}$ alkyl group). Examples thereof include a methoxy group, an ethoxy group, and an isopropyloxy group.

The term "$C_3$-$C_{10}$ cycloalkyl group" as used herein refers to a monovalent saturated hydrocarbon monocyclic group including 3 to 10 carbon atoms. Examples of the $C_3$-$C_{10}$ cycloalkyl group as used herein include a cyclopropyl group, a cyclobutyl group, a cyclopentyl group, a cyclohexyl group, a cycloheptyl group, a cyclooctyl group, an adamantanyl group, a norbornanyl (bicyclo[2.2.1]heptyl) group, a bicyclo[1.1.1]pentyl group, a bicyclo[2.1.1]hexyl group, or a bicyclo[2.2.2]octyl group. The term "$C_3$-$C_{10}$ cycloalkylene group" as used herein refers to a divalent group having a structure corresponding to the $C_3$-$C_{10}$ cycloalkyl group.

The term "$C_1$-$C_{10}$ heterocycloalkyl group" as used herein refers to a monovalent cyclic group including at least one heteroatom other than carbon atoms as a ring-forming atom and having 1 to 10 carbon atoms. Examples thereof include a 1,2,3,4-oxatriazolidinyl group, a tetrahydrofuranyl group, and a tetrahydrothiophenyl group. The term "$C_1$-$C_{10}$ heterocycloalkylene group" as used herein refers to a divalent group having a structure corresponding to the $C_1$-$C_{10}$ heterocycloalkyl group.

The term "$C_3$-$C_{10}$ cycloalkenyl group" as used herein refers to a monovalent cyclic group that has 3 to 10 carbon atoms and at least one carbon-carbon double bond in its ring, and is not aromatic. Examples thereof include a cyclopentenyl group, a cyclohexenyl group, and a cycloheptenyl group. The term "$C_3$-$C_{10}$ cycloalkenylene group" as used herein refers to a divalent group having a structure corresponding to the $C_3$-$C_{10}$ cycloalkenyl group.

The term "$C_1$-$C_{10}$ heterocycloalkenyl group" as used herein refers to a monovalent cyclic group including at least one heteroatom other than carbon atoms as a ring-forming atom, 1 to 10 carbon atoms, and at least one double bond in its ring. Examples of the $C_1$-$C_{10}$ heterocycloalkenyl group include a 4,5-dihydro-1,2,3,4-oxatriazolyl group, a 2,3-dihydrofuranyl group, and a 2,3-dihydrothiophenyl group. The term "$C_1$-$C_{10}$ heterocycloalkylene group" as used herein refers to a divalent group having a structure corresponding to the $C_1$-$C_{10}$ heterocycloalkyl group.

The term "$C_6$-$C_{60}$ aryl group" as used herein refers to a monovalent group having a carbocyclic aromatic system having 6 to 60 carbon atoms. The term "$C_6$-$C_{60}$ arylene group" as used herein refers to a divalent group having a carbocyclic aromatic system having 6 to 60 carbon atoms. Examples of the $C_6$-$C_{60}$ aryl group include a phenyl group, a pentalenyl group, a naphthyl group, an azulenyl group, an indacenyl group, an acenaphthyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a heptalenyl group, a naphthacenyl group, a picenyl group, a hexacenyl group, a pentacenyl group, a rubicenyl group, a coronenyl group, and an ovalenyl group. When the $C_6$-$C_{60}$ aryl group and the $C_6$-$C_{60}$ arylene group each independently include two or more rings, the respective rings may be fused.

The term "$C_1$-$C_{60}$ heteroaryl group" as used herein refers to a monovalent group having a heterocyclic aromatic system further including at least one heteroatom other than carbon atoms as a ring-forming atom, and 1 to 60 carbon atoms. The term "$C_1$-$C_{60}$ heteroarylene group" as used herein refers to a divalent group having a heterocyclic aromatic system further including at least one heteroatom other than carbon atoms as a ring-forming atom, and 1 to 60 carbon atoms. Examples of the $C_1$-$C_{60}$ heteroaryl group include a pyridinyl group, a pyrimidinyl group, a pyrazinyl group, a pyridazinyl group, a triazinyl group, a quinolinyl group, a benzoquinolinyl group, an isoquinolinyl group, a benzoisoquinolinyl group, a quinoxalinyl group, a benzoquinoxalinyl group, a quinazolinyl group, a benzoquinazolinyl group, a cinnolinyl group, a phenanthrolinyl group, a phthalazinyl group, a naphthyridinyl group, a pyrrolyl group, a thiophenyl group, and a furanyl group. When the $C_1$-$C_{60}$ heteroaryl group and the $C_1$-$C_{60}$ heteroarylene group each independently include two or more rings, the respective rings may be fused.

The term "monovalent non-aromatic fused polycyclic group" as used herein refers to a monovalent group that has two or more fused rings and only carbon atoms (e.g., 8 to 60 carbon atoms) as ring forming atoms, wherein the molecular structure when considered as a whole is non-aromatic. Examples of the monovalent non-aromatic fused polycyclic group include an indenyl group, a fluorenyl group, a spirobifluorenyl group, a benzofluorenyl group, an indenophenanthrenyl group, and an indenoanthracenyl group. The term "divalent non-aromatic fused polycyclic group" as used herein refers to a divalent group having substantially a structure corresponding to the monovalent non-aromatic fused polycyclic group.

The term "monovalent non-aromatic fused heteropolycyclic group" as used herein refers to a monovalent group that has two or more fused rings and at least one heteroatom other than carbon atoms (e.g., 1 to 60 carbon atoms), as a ring-forming atom, wherein the molecular structure when considered as a whole is non-aromatic. Examples of the monovalent non-aromatic fused heteropolycyclic group include a pyrrolyl group, a thiophenyl group, a furanyl group, an indolyl group, a benzoindolyl group, a naphthoindolyl group, an isoindolyl group, a benzoisoindolyl group, a naphthoisoindolyl group, a benzosilolyl group, a benzothiophenyl group, a benzofuranyl group, a carbazolyl group, a dibenzosilolyl group, a dibenzothiophenyl group, a dibenzofuranyl group, an azacarbazolyl group, an azafluorenyl group, an azadibenzosilolyl group, an azadibenzothiophenyl group, an azadibenzofuranyl group, a pyrazolyl group, an imidazolyl group, a triazolyl group, a tetrazolyl group, an oxazolyl group, an isoxazolyl group, a thiazolyl group, an isothiazolyl group, an oxadiazolyl group, a thiadiazolyl group, a benzopyrazolyl group, a benzimidazolyl group, a benzoxazolyl group, a benzothiazolyl group, a benzooxadiazolyl group, a benzothiadiazolyl group, an imidazopyridinyl group, an imidazopyrimidinyl group, an imidazotriazinyl group, an imidazopyrazinyl group, an imidazopyridazinyl group, an indenocarbazolyl group, an indolocarbazolyl group, a benzofurocarbazolyl group, a benzothienocarbazolyl group, a benzosilolocarbazolyl group, a benzoindolocarbazolyl group, a benzocarbazolyl group, a benzonaphthofuranyl group, a benzonaphthothiophenyl group, a benzonaphthosilolyl group, a benzofurodibenzofuranyl group, a benzofurodibenzothiophenyl group, and a benzothienodibenzothiophenyl group. The term "divalent non-aromatic fused heteropolycyclic group" as used herein refers to a divalent group having substantially a structure corresponding to the monovalent non-aromatic fused heteropolycyclic group.

The term "$C_6$-$C_{60}$ aryloxy group" as used herein is represented by —$OA_{102}$ (wherein $A_{102}$ is the $C_6$-$C_{60}$ aryl group). The term "$C_6$-$C_{60}$ arylthio group" as used herein is represented by —$SA_{103}$ (wherein $A_{103}$ is the $C_6$-$C_{60}$ aryl group).

The term "heteroatom" as used herein refers to any atom other than a carbon atom. Examples of the heteroatom may include O, S, N, P, Si, B, Ge, Se, or any combination thereof.

The term "biphenyl group" as used herein refers to a phenyl group substituted with a phenyl group. The "biphenyl group" may be a substituted phenyl group having a $C_6$-$C_{60}$ aryl group as a substituent.

The term "terphenyl group" as used herein refers to a phenyl group substituted with a biphenyl group. The "terphenyl group" may be a substituted phenyl group having a $C_6$-$C_{60}$ aryl group substituted with a $C_6$-$C_{60}$ aryl group as a substituent.

Hereinafter, a display apparatus according to one or more embodiments will be described in more detail with reference to Examples.

EXAMPLES

Evaluation Example 1: Evaluation of Reflectance and Efficiency of Display Apparatus As Apparatus 1, a display panel according to an embodiment was prepared. Apparatus 1 included a low-reflection inorganic layer on a display device layer and including bismuth (Bi) as an inorganic material; and a reflection-controlling layer including a tetraazaporphyrin-based compound as a dye.

In addition, unlike Apparatus 1 including the low-reflection inorganic layer and the reflection-controlling layer, a display panel including a polarizing plate for preventing reflection was prepared as Comparative Apparatus 1.

In addition, unlike Apparatus 1 including the low-reflection inorganic layer and the reflection-controlling layer, a display panel including a color filter for preventing reflection was prepared as Comparative Apparatus 2. Otherwise, Apparatus 1 and Comparative Apparatuses 1 and 2 were prepared under substantially the same conditions and procedures, and with the same equipment.

The reflectance and transmittance of Apparatus 1, Comparative Apparatus 1, and Comparative Apparatus 2 were measured. The results thereof are shown in Table 1. The reflectance was measured when light was incident from the outside without driving each display panel. The reflectance and transmittance in Table 1 are shown as relative values.

TABLE 1

|  | Apparatus 1 (including a low-reflection inorganic layer and a reflection-controlling layer) | Comparative Apparatus 1 (including a polarizing plate) | Comparative Apparatus 2 (including a color filter) |
|---|---|---|---|
| Transmittance (relative value) | 130 | 100 | 130 |
| Reflectance (relative value) | 5.3 | 4.8 | 5.2 |

Referring to the results of Table 1, as compared with Comparative Apparatus 1 to which a polarizing plate was applied, it may be seen that Apparatus 1 had excellent transmittance and an equivalent level of reflectance.

In addition, in forming of color filters in Comparative Apparatus 2, four sheets of masks may be additionally needed for forming a red color filter, a green color filter, a blue color filter, and an overcoating layer; however, Apparatus 1 had a transmittance and a reflectance equal to or better than Comparative Apparatus 2, without forming of the color filters.

Evaluation Example 2: Optical Efficiency and Reflectance According to Thickness of Low-Reflection Inorganic Layer and Capping Layer Apparatuses 2 to 6, which use display panels according to one or more embodiments, were prepared. Apparatuses 2 to 6 included: a low-reflection inorganic layer located on display device layer and including bismuth (Bi) as an inorganic material; and a reflection-controlling layer including a tetraazaporphyrin-based compound as a dye, and the thicknesses of the low-reflection inorganic layer and the capping layer thereof are as shown in Tables 2 and 3.

In addition, Comparative Apparatus 3 having the same structure as Apparatus 2 was prepared, except that Comparative Apparatus 3 did not include a low-reflection inorganic layer. Apparatuses 2-6 and Comparative Apparatus 3 were prepared under substantially the same conditions and procedures, and with the same equipment.

The integrated reflectance of each of Apparatuses 2 to 6 and Comparative Apparatus 3 in a specular component included (SCI) mode was measured by using a source-measure unit (SMU) sold under the trade designation Keithley 236 by Tektronix, Inc., of Beaverton, Oregon and a luminance meter sold under the trade designation PR650 from Konica Minolta, Inc. of Tokyo, Japan. The results thereof are shown in Table 2. In addition, transmission efficiency versus a polarizing plate of each of Apparatuses 2 to 6 was measured. The results thereof are shown in Table 3. The transmission efficiencies versus a polarizing plate are relative values, based on the transmission efficiency of Comparative Apparatus 1 as 100.

TABLE 2

|  | Comparative Apparatus 3 | Apparatus 2 | Apparatus 3 | Apparatus 4 | Apparatus 5 | Apparatus 6 |
| --- | --- | --- | --- | --- | --- | --- |
| Thickness of low-reflection inorganic layer (Å) | 0 | 80 | 100 | 120 | 100 | 100 |
| Thickness of capping layer (Å) | 640 | 640 | 640 | 640 | 450 | 255 |
| SCI (%) | 12.5 | 9.3 | 8.1 | 7.4 | 6.8 | 6.6 |

TABLE 3

|  | Comparative Apparatus 3 | Apparatus 2 | Apparatus 3 | Apparatus 4 | Apparatus 5 | Apparatus 6 |
| --- | --- | --- | --- | --- | --- | --- |
| Thickness of low-reflection inorganic layer (Å) |  | 80 | 100 | 120 | 100 | 100 |
| Thickness of capping layer (Å) |  | 640 | 640 | 640 | 450 | 255 |
| Transmission efficiency versus polarizing plate (relative value) |  | 170.2 | 143.6 | 109.8 | 152.2 | 162.8 |

Referring to the results of Table 2, Apparatuses 2 to 6 were each found to have improved visibility due to a significantly low integrated reflectance, as compared with Comparative Apparatus 3. In addition, referring to the results of Table 3, Apparatuses 2 to 6 were each found to have excellent transmission efficiency versus a polarizing plate.

As apparent from the foregoing description, the display apparatus constructed according to the principles and certain embodiments of the invention may have improved visibility and optical efficiency due to reduced external light reflectance.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display apparatus comprising:
    a substrate;
    a layer disposed on the substrate and including an organic light-emitting device;
    a low-reflection inorganic layer disposed on the layer and comprising an inorganic material;
    a light-blocker disposed on the low-reflection inorganic layer; and
    a reflection-controlling layer disposed on the light-blocker,
    wherein the reflection-control-ling layer comprises a compound comprising an oxazine moiety, a compound comprising a cyanine moiety, a compound comprising a tetraazaporphyrin moiety, or a com-pound comprising a squarylium moiety.

2. The display apparatus of claim 1, wherein the inorganic material has a refractive index of about 1 or greater.

3. The display apparatus of claim 1, wherein the inorganic material has an absorption coefficient of about 0.5 or greater.

4. The display apparatus of claim 1, wherein the low-reflection inorganic layer is made by thermal deposition of the inorganic material.

5. The display apparatus of claim 1, wherein the low-reflection inorganic layer has a thickness of about 0.1 nm to about 50 nm.

6. The display apparatus of claim 1, wherein the layer comprises a display device layer, the display device layer comprising the organic light-emitting device, and
    the organic light-emitting device comprises: a pixel electrode; an interlayer disposed on the pixel electrode and including an emission layer; and a counter electrode on the interlayer.

7. The display apparatus of claim 6, wherein the display device layer further comprises a capping layer on the counter electrode, and the low-reflection inorganic layer is on the capping layer.

8. The display apparatus of claim 7, wherein the capping layer has a thickness in a range of about 1 nm to about 200 nm.

9. The display apparatus of claim 1, wherein the reflection-controlling layer comprises a dye, a pigment, or any combination thereof.

10. The display apparatus of claim 1, wherein a maximum absorption wavelength of the reflection-controlling layer has a first wavelength range of about 480 nm to about 510 nm or a second wavelength range of about 580 nm to about 610 nm.

11. The display apparatus of claim 1, wherein a reflectance in a specular component included mode at a surface of the reflection-controlling layer is about 10% or less.

12. The display apparatus of claim 1, wherein the display apparatus does not comprise a polarizing plate.

13. The display apparatus of claim 1, wherein the display apparatus does not comprise a wavelength-conversion member or a color-conversion member.

14. The display apparatus of claim 1, wherein the light-blocker comprises a light-blocking unit and the display apparatus further comprises a thin-film encapsulation layer between the low-reflection inorganic layer and the light-blocking unit.

15. The display apparatus of claim 14, wherein the display apparatus further comprises a functional layer between the thin-film encapsulation layer and the reflection-controlling layer.

16. The display apparatus of claim 1, wherein the display apparatus further comprises a thin-film transistor electrically connected to the organic light-emitting device.

17. The display apparatus of claim 16, wherein the thin-film transistor comprises a semiconductor layer and a gate electrode overlapping a channel area of the semiconductor layer.

18. The display apparatus of claim 1, wherein the inorganic material comprises ytterbium, bismuth, cobalt, molybdenum, titanium, zirconium, aluminum, chromium, niobium, platinum, tungsten, indium, tin, iron, nickel, tantalum, manganese, zinc, germanium, or any combination thereof.

19. A display apparatus comprising:
a substrate;
a layer disposed on the substrate and including an organic light-emitting device;
a low-reflection inorganic layer disposed on the layer and comprising an inorganic material;
a light-blocker disposed on the low-reflection inorganic layer; and
a reflection-controlling layer disposed on the light-blocker,
wherein the inorganic material is ytterbium, bismuth, cobalt, molybdenum, titanium, zirconium, aluminum, chromium, niobium, platinum, tungsten, indium, tin, iron, nickel, tantalum, manganese, zinc, germanium, or any combination thereof, and
wherein the reflection-controlling layer comprises a compound represented by one of Formulae 1 to 4:

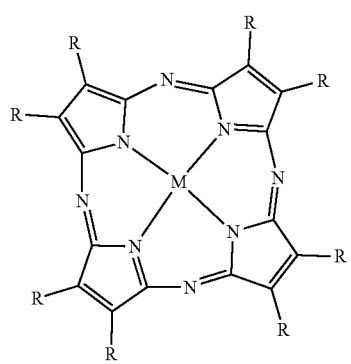

Formula 1

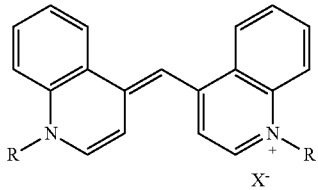

Formula 2

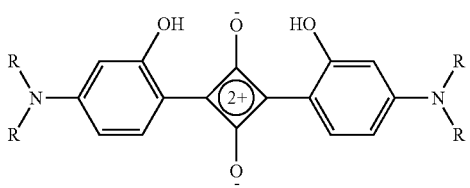

Formula 3

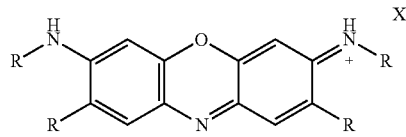

Formula 4 wherein, in Formulae 1 to 4,
M is a metal,
$X^-$ is a monovalent anion,
R(s) are each, independently from one another:
hydrogen, deuterium, —F, —Cl, —Br, —I, a hydroxyl group, a cyano group, or a nitro group;
a $C_1$-$C_{60}$ alkyl group, a $C_2$-$C_{60}$ alkenyl group, a $C_2$-$C_{60}$ alkynyl group, or a $C_1$-$C_{60}$ alkoxy group, each independently from one another, unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), —P(=O)($Q_{11}$)($Q_{12}$), or any combination thereof;
a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each independently from one another, unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), —P(=O)($Q_{21}$)($Q_{22}$), or any combination thereof; or
Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), or —P(=O)($Q_{31}$)($Q_{32}$),
wherein $Q_{11}$ to $Q_{13}$, $Q_{21}$ to $Q_{23}$, and $Q_{31}$ to $Q_{33}$ are, each independently from one another: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; a $C_3$-$C_{60}$ carbocyclic group; or a $C_1$-$C_{60}$ heterocyclic group each, independently from one another, unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

* * * * *